Dec. 25, 1962 E. J. SLOBODZINSKI 3,070,709

INVENTER CIRCUIT AND COMPLEMENTING FLIP-FLOP USING CONSTANT CURRENT SOURCES AND ISOLATED COLLECTOR TO EMITTER CONNECTIONS

Filed May 22, 1958

INVENTOR
EDWIN J. SLOBODZINSKI

BY Paul McEnlow

ATTORNEY

United States Patent Office 3,070,709
Patented Dec. 25, 1962

3,070,709

INVERTER CIRCUIT AND COMPLEMENTING FLIP-FLOP USING CONSTANT CURRENT SOURCES AND ISOLATED COLLECTOR TO EMITTER CONNECTIONS

Edwin J. Slobodzinski, Hopewell Junction, N.Y., assignor to International Business Machines Corporation, New York, N.Y., a corporation of New York Filed May 22, 1958, Ser. No. 737,120
5 Claims. (Cl. 307—88.5)

This invention relates to switching circuits, and more particularly to switching and trigger circuits employing semiconductive devices.

The invention provides a novel cascode inverting circuit comprising a first semiconductive device having the emitter thereof reverse biased against conduction. The emitter is connected to a high impedance current source to improve switching of the conductive state of said device. Input signals are applied to the base of said device. A second semiconductive device operated as a common base stage serves as the load impedance of said first device to further improve the switching speed characteristics of the novel inverter.

A novel high speed Eccles-Jordan type trigger circuit can be constructed utilizing a pair of the novel cascode inverters. Suitable cross coupling components are provided to retain the novel trigger in the state assumed until another input pulse is received. A gating circuit responsive to the outputs of both inverters is coupled between an input terminal and the input of each of the inverters for the purpose of gating each input pulse to the inverter that is currently Off. An output signal can be derived from the collector of the common base stages of each of the cascode inverters.

Accordingly, an object of the invention is to provide an improved transistor inverter circuit having improved frequency response and operable at high speeds.

Another object is to provide an improved transistor inverting circuit comprising a first transistor responsive to an input signal to produce an output current, a second transistor operative as a common base stage and responsive to said output current to produce an output voltage signal.

A further object is to provide a novel inverting circuit having improved frequency response and comprising first and second transistors connected in cascode, one of said transistors coupled to an input signal source and also having the emitter thereof coupled to a constant current source.

An additional object is to provide a novel transistor switching circuit comprising a first transistor having the base thereof coupled to an input signal terminal, a potential source for reverse biasing the emitter thereof including a diode for limiting the emitter-to-base bias potential, a constant current source coupled to the emitter thereof, and a further transistor functioning as a common base stage and connected as the collector load impedance of said first transistor.

Another object is to provide an improved trigger circuit operable at high speeds and employing cascoded semiconductive devices.

It is also an object to provide a novel high speed trigger circuit comprising first and second transistors each having a load impedance comprising a transistor connected as a common base stage, and said first and second transistors having a common emitter circuit connected to a constant current source whereby the trigger circuit is switchable from one state to another at very high speeds.

Another object is to provide a novel trigger circuit comprising first and second transistors connected in a bistable circuit arrangement including a common emitter circuit which is operative to transfer conduction from one transistor to the other in response to the application of an input pulse to one of said transistors.

A further object is to provide a novel trigger circuit employing first and second transistors as inverters, each transistor having a potential source and a diode connected to the base thereof to limit the base-to-emitter cutoff bias to substantially the forward voltage drop across the diode, the emitters of said first and second transistors being connected to a constant current source for effectuating the transfer of said trigger circuit from one state to the other, and third and fourth transistors operative as common base stages and respectively connected as the load impedance of said first and second transistors, whereby the time required to switch said trigger circuit from one bistable state to the other is substantially reduced.

Other objects of the invention will be pointed out in the following description and claims and illustrated in the accompanying drawings, which disclose, by way of example, the principle of the invention and the best mode, which has been contemplated, of applying that principle.

Figure 1:
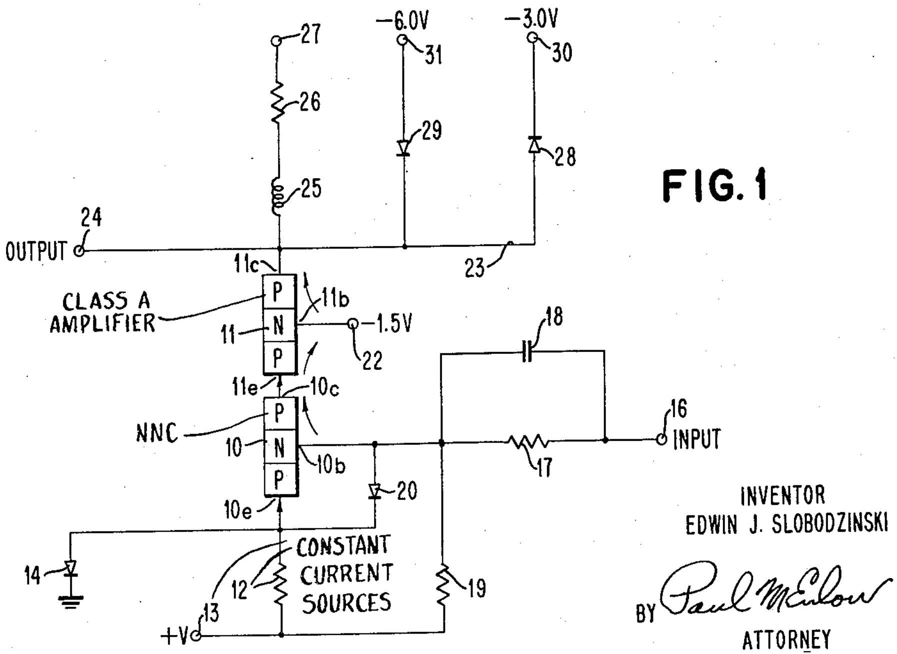
FIG. 1 illustrates the novel inverter.

Referring more particularly to FIG. 1, an embodiment of the invention in the form of an inverting circuit is illustrated. The circuit of FIG. 1 is characterized as an inverter in that the application of a negative direction voltage signal, for example, to the input of the circuit causes a positive direction signal to appear at the output thereof, and vice versa.

The inverter includes transistors 10 and 11 which are respectively provided with emitter electrodes 10*e* and 11*e*, base electrodes 10*b* and 11*b*, and collector electrodes 10*c* and 11*c*. Transistor 10 is responsive to input signals to control the collector current thereof. The collector current of transistor 10 becomes the emitter current of transistor 11 which operates as a common base stage and serves as the collector load impedance of transistor 10.

Emitter 10*e* is connected through resistor 12 to a positive voltage source 13, and is also connected through diode 14 to ground. Diode 14 is connected to conduct current in the forward direction from resistor 12 and voltage source 13 to ground.

The purpose of resistor 12 is to improve the frequency response of the inverter by regenerative action. Resistor 12 also defines the On emitter current of transistor 10. The primary purpose of diode 14 is to provide an alternate current path for the current through resistor 12 when transistor 10 is turned off. The +V voltage source 13 in conjunction with resistor 12 comprises a high impedance current source feeding a current node. Since an input pulse applied to the base of transistor 10 constitutes a relatively small voltage change, the emitter current cannot be substantially diminished unless there is another device, such as diode 14, or another transistor, to conduct this current. Furthermore, since diode 14 is connected between emitter 10*e* and ground, it prevents the emitter from becoming more positive than the potential determined by the forward voltage drop of diode 14. This action serves to establish a reference level with respect to input voltage signals which are applied to the base of the transistor.

The input terminal 16 is connected through the parallel combination of resistor 17 and capacitor 18 to base electrode 10*b* of transistor 10. Base electrode 10*b* is also connected through resistor 19 to the positive voltage source 13. The anode of diode 20 is connected to base electrode 10*b* and the cathode thereof is connected to emitter electrode 10*e*. Resistor 19 in conjunction with diodes 20 and 14 serves to bias base electrode 10*b* positively with respect to the emitter thereof so that transistor 10 is normally non-conductive or Off. When an input signal is not applied to input terminal 16, current flowing from voltage source 13 through resistor 19 and diodes 20 and 14 to ground establishes a potential difference between base **10*b* and emitter 10*e* equal to the forward voltage drop across diode 20. This potential difference is sufficient to cut off transistor 10. Diode 20** also prevents the base potential from going too far into the cutoff region, thereby eliminating any delay due to time required to drive the base back into conduction.

An inverting circuit utilizing a system similar to FIG. 1 for positively biasing the base of a transistor with respect to the emitter thereof through the medium of a nonlinear impedance connected between the base and emitter electrode is disclosed and claimed in the copending application of J. C. Logue and J. L. Walsh, Serial No. 583,584, filed May 8, 1956, which is incorporated herein by reference.

Collector electrode **10*c* of transistor 10 is connected directly to emitter electrode 11*e* of transistor 11. Base electrode 11*b* is connected to voltage source 22, and thus transistor 11 operates as a common base stage. Collector 11*c* is connected by lead 23 to output terminal 24, and through peaking inductance 25 and load resistor 26 to the negative voltage source 27. Clamping diodes 28 and 29 are respectively connected to conduct current from lead 23 towards the —3.0 volt source 30, and from the —6.0 volt source 31 towards lead 23. Lead 23 and thus collector 11*c* is prevented from becoming more positive than —3.0 volts, for example, by clamping diode 28, and from becoming more negative than —6.0 volts by clamping diode 29**. The recited clamping potentials are merely illustrative and other potentials can be used in an embodiment of the invention.

Input signals applied to input terminal 16 of FIG. 1 generally vary between two voltage values, as for example, —3 volts and —6 volts. In this instance, the no-signal level would be —3 volts, which permits the base **10*b* to be biased positively by a few tenths of a volt. When the base is positive with respect to the emitter, transistor 10** is Off.

Upon the receipt of an input pulse the potential of terminal 16 is changed from —3 volts to —6 volts, thereby driving the base **10*b* in a negative direction. When the potential of the base becomes negative, diode 20 is cut off thereby permitting the base to become negative with respect to emitter 10*c*. The removal of the reverse bias on the emitter causes emitter current to flow, thus turning On transistor 10. The collector of transistor 10 is connected to the emitter of transistor 11 and therefore the collector current of transistor 10 is the emitter current of transistor 11. Transistor 11 operates as a class A amplifier and thus amplifies the collector current of transistor 10. Accordingly, the negative direction signal applied to terminal 16 causes increased collector current to flow from transistor 11 through load resistor 26. The increased current flow through resistor 26 produces a greater voltage drop thereacross which increases the potential of conductor 23 in a positive direction. As noted previously, diode 28 clamps the potential of conductor 23, thus prohibiting it from becoming more positive than the potential of terminal 30. While input terminal 16 remains at the negative excursion (—6 volts), conductor 23 and output terminal 24** will be at the positive potential excursion (—3 volts).

At the termination of the input signal, terminal 16 rises to —3 volts which permits the potential of base **10*b* to increase towards ground potential. When base 10*b* becomes slightly more positive than ground potential, diode 20 conducts thereby clamping the base potential at a point determined by source 13, resistor 19 and diodes 20 and 14. The forward voltage drop across diode 20 is sufficient to reverse bias emitter 10*e* thus turning transistor 10** Off.

As transistor 10 is turned Off, the collector current thereof decreases whereupon the collector current of transistor 11 decreases. The decreased current flow through load resistor 26 causes the voltage drop thereacross to be diminished so that the potential of conductor 23 becomes more negative. The potential of conductor 23 is clamped by diode 29 at the —6 volt potential of terminal 31.

The effect of transistors 61 and 41 on inverters 60 and 40 respectively, is to limit the collector voltage excursion of transistors 60 and 40 thereby reducing to a minimum the displacement current necessary to charge any reactance at these collectors. Since the inherent collector capacitance of transistors 40 and 60 acts to reduce the bandwidth of these inverters, limiting the charging current in these capacitances, by limiting voltage swing, enhances the response of these inverters.

The common emitter node tied to an essentially constant current source serves two functions. One, to limit the On emitter current to a predetermined value thereby permitting an On state out of saturation for transistors 40 and 60. Secondly, the common emitter bus also serves to enhance response time in that a negative excursion on the base of the previously Off transistor is coupled to the emitter of the previously On transistor by emitter follower action, thereby turning Off the previously On transistor.

Figure 2:
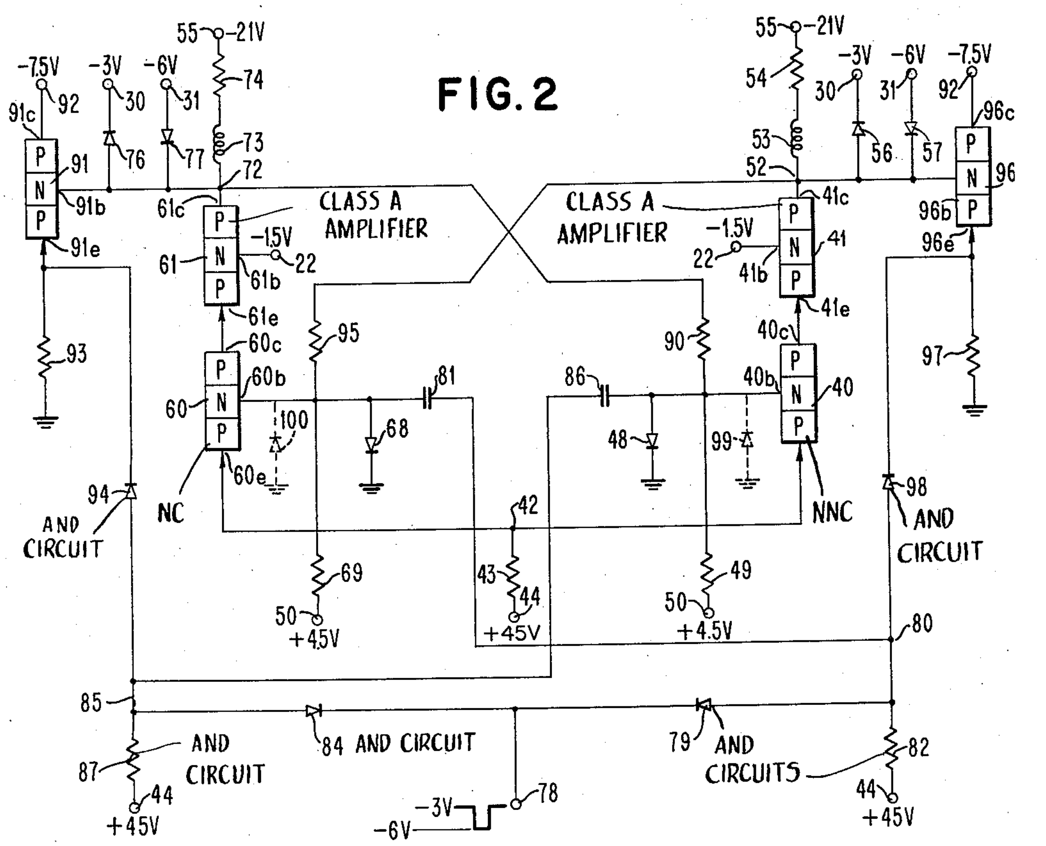
FIG. 2 is a schematic diagram of a novel high speed trigger circuit.

Referring more particularly to FIG. 2, a trigger circuit embodying the invention of FIG. 1 is illustrated. By employing the inverting circuit of FIG. 1 in the trigger circuit of FIG. 2, the speed at which the trigger is switched from one state to another is greatly increased over speeds heretofore attainable by trigger circuits employing semiconductive devices.

The trigger circuit of FIG. 2 comprises a pair of cross-coupled inverters similar to the type shown in FIG. 1. The right-hand inverter of the trigger pair includes transistors 40 and 41 which are respectively provided with emitter electrodes **40*e* and 41*e*, base electrodes 40*b* and 41*b*, and collector electrodes 40*c* and 41*c*. Emitter electrode 40*e* is connected via juncture 42 through resistor 43 to the +45 volt source 44. Base electrode 40*b* is connected to the anode of diode 48 and through resistor 49 to the +4.5 volt source 50. The cathode of diode 48 is connected to ground thus preventing base electrode 40*b*** from being more positive than ground potential.

Emitter electrode **41*e* of transistor 41 is connected to collector electrode 40*c* of transistor 40. Base electrode 41*b* of transistor 41 is connected to the —1.5 volt source 22, and collector electrode 41*c* is connected to juncture 52. The collector load impedance of transistor 41 comprises inductance 53 and resistor 54 which are connected in series between juncture 52 and the —21 volt source 55. Juncture 52 is connected to the anode of diode 56 and to the cathode of diode 57. The cathode of diode 56 and the anode of diode 57 are respectively connected to the —3 volt source 30 and the —6 volt source 31**.

The left-hand inverter of the trigger circuit comprises transistors 60 and 61 which are respectively provided with emitter electrodes **60*e* and 61*e*, base electrodes 60*b* 61*b*, and collector electrodes 60*c* and 61*c*. Emitter electrode 60*e* of transistor 60 is connected to juncture 42 and collector 60*c* is connected to emitter 61*e* of transistor 61. The base of transistor 60 is connected through resistor 69 to the +4.5 volt source 50, and is also connected to the anode of diode 68. The cathode of diode 68** is connected to ground.

Base **61*b* of transistor 61 is connected to the —1.5 volt bias source 22. Collector 61*c* is connected to juncture 72 and also through inductance 73 and resistor 74 in series to the —21 volt source 55. The potential of juncture 72 is clamped between the limits of —3 volts and —6 volts by diodes 76 and 77 respectively. The anodes of diodes 76 and 77 are respectively connected to juncture 72 and the —6 volt source 31**, while the cathodes thereof are respectively connected to the —3 volt source 30 and juncture 72.

The base 40b of transistor 40 is cross-coupled to the collector 61c of transistor 61 by resistor 90. Similarly, resistor 95 cross-coupled base 60b of transistor 60 to the collector 41c of transistor 40. The purpose of resistors 90 and 95 is to apply a potential to the base of a transistor of one inverter which is indicative of the potential level existing at the collector of a transistor associated with the other inverter of the trigger circuit. For example, when the state of the trigger circuit is such that transistor 40 is Off and transistor 60 is On, transistors 40 and 41 are conducting minimum current. Thus juncture 52 is Down, that is, at its most negative level of —6 volts. Under this condition current flow from the positive voltage source 50 to juncture 52 through resistors 69 and 95 causes the base potential of transistor 60 to be negative with respect to the emitter thereof. Since the base of transistor 60 is negative with respect to the emitter the transistor is conductive and thus is On. Therefore, resistor 95 serves to control the potential of base 60b, in accordance with the potential of juncture 52.

Similarly, the resistor 90 controls the potential of base 40b in accordance with the potential of juncture 72. Assuming that transistor 40 is Off and transistor 60 is On, the current flow through transistors 60 and 61 causes a voltage drop across impedances 73 and 74. The current flow through impedances 73 and 74 renders juncture 72 positive with respect to the negative voltage source 55 thereby causing juncture 72 to be Up, that is, at its most positive potential level of —3 volts. Resistors 49 and 90 comprise a voltage divider similar to the network formed by resistors 69 and 95 referred to above. However, since juncture 72 is positive with respect to juncture 52 when transistor 60 is On, less current will be flowing through resistor 90. Accordingly, base 40b of transistor 40 is at a potential slightly positive with respect to ground as determined by the forward voltage drop across diode 48. Hence base 40b is more positive than base 60b. Base 40b being positive with respect to emitter 40e causes transistor 40 to remain Off.

It is clear therefore that resistors 90 and 95 serve to maintain the transistors 40 and 60 in a predetermined conductive condition which is established by the most recent input pulse.

Input terminal 78 is connected to the cathode of diode 79, the anode which is connected to juncture 80. Capacitor 81 is connected between base 60b and juncture 80. Juncture 80 is connected to the anode of diode 98 and also through resistor 82 to the +45 volt source 44. Diodes 79 and 98 and resistor 82 constitute a logical AND circuit, which in conjunction with capacitor 81, comprise the input gating circuit for transistor 60. Similarly, the input gating circuit of transistor 40 includes diodes 84 and 94, resistor 87, and capacitor 86. Components 84, 87 and 94 comprise a logical AND circuit. Diode 84 is connected in the forward direction between juncture 85 and input terminal 78. The anode of diode 84 is connected to one terminal of capacitor 86. The other terminal of the capacitor is connected to base 40b. Juncture 85 is connected to the anode of diode 94 and also through resistor 87 to +45 volt source 44. It will be shown hereinbelow that the purpose of the two AND circuits referred to is to determine which of the transistors 40 and 60 is to receive an input pulse. It is to be noted that the other input gating circuits may be utilized in the invention of FIG. 2, as for example, any of the gating circuits disclosed and claimed in co-pending application Serial No. 459,381, filed September 30, 1954, by Robert A. Henle et al.

Briefly, the input gating circuit of the trigger circuit of FIG. 2 comprises a pair of logical AND circuits. One input of each of the AND circuits is connected to the input terminal 78 and thus is responsive to each input pulse. The remaining input of each of the AND circuits is coupled through an emitter follower to an output point of the respective inverters comprising the trigger circuit. Since one of the inverters will be On and the other Off, the second input of one of the AND circuits must be Up, whereas the second input of the other AND circuit must be Down. Prior to the receipt of an input signal the AND circuit coupled to the On inverter will have both of the terminals thereof Up, and the AND circuit coupled to the Off inverter will have one input Up and one input Down. The negative direction input pulse will have no effect upon the AND circuit which has not been experiencing coincidence, but will cause the output of the other AND circuit to go Down. The negative direction output from the latter AND circuit is coupled to the transistor which was previously Off thereby turning in On. Turning On the previously Off transistor causes juncture 42 to become more negative than the base of the previously On transistor thereby turning it Off. After the Off transistor is turned On, the cross-coupling resistors 95 and 90 referred to above cause the newly established state of the trigger circuit to be maintained.

In FIG. 2 the AND circuit controlling the input to transistors 40 comprises diodes 84 and 94 and resistor 87. The cathode of diode 84 is connected to one input of the AND circuit and is responsive to input signals applied to terminal 78. The cathode of diode 94 comprises the other input of the AND circuit and is responsive to the output of emitter follower 91. The output of the AND circuit is juncture 85 which is coupled through capacitor 86 to base 40b.

Transistor 91 is connected as an emitter follower circuit between juncture 72 and the cathode of diode 94. An emitter follower circuit provides a function similar to the well-known cathode follower in that a phase inversion is not produced in transmitting a signal through the stage. An emitter follower circuit similar to the circuit described herein is disclosed in the co-pending application of George D. Bruce et al., Serial No. 459,382, filed September 30, 1954, now Patent No. 2,888,578.

The input of emitter follower 91 is the base electrode 91b which is connected to juncture 72. Collector 91c is connected to the —7.5 volt source 92 and the emitter 91e is connected through resistor 93 to ground. Emitter 91e constitutes the output of the emitter follower stage and is connected to the cathode of diode 94. When the potential of juncture 72 is Down, that is at its most negative value of —6 volts, the base of transistor 91 is negative with respect to the emitter thereof and thus the transistor is rendered conductive. Emitter current flowing upward through resistor 93 produces a voltage drop thereacross causing emitter 91e to be negative with respect to ground. When transistor 91 is On, emitter 91e is at approximately —6 volts. On the other hand, when juncture 72 is Up, that is at approximately —3 volts, less emitter current flows through resistor 93 thereby causing emitter 91e to rise to a potential of approximately —3 volts. Accordingly, it is seen that the emitter 91e of the emitter follower stage 91 is always at the potential currently manifested at juncture 72.

The purpose of the emitter follower stage is to isolate juncture 72 from the AND circuit of the input gating network so as to reduce the loading effects on the collector 61c by the gating circuit. The emitter follower stage has a very high input impedance and a low output impedance at the emitter thereof, thus providing suitable isolation between collector 61c and diode 94.

Similarly, emitter following stage 96 coupled juncture 52 to the cathode of diode 98 which is one input of the AND circuit comprising diodes 79 and 98. The base 96b of transistor 96 is connected to juncture 52, collector 96c is connected to the —7.5 voltage source 92, and emitter 96e is connected to the cathode of diode 98 and also through resistor 97 to ground. The operation of emitter follower stage 96 is similar to the emitter follower 91 described hereinabove. Accordingly, emitter follower 96 is responsive to the potential at juncture 52 to cause the cathode of diode 98 to be at approximately the same potential.

In order to attain fast switching speeds the voltage swing at the base of transistors 40 and 60 must be very small. This objective can be achieved by the addition of diodes 99 and 100 of FIG. 2. Diodes 99 and 100 are connected to conduct current towards the base electrodes 40*b* and 60*b*, respectively. As explained hereinabove, diodes 48 and 68 respectively prevent the bases of transistors 40 and 60 from becoming more positive than the voltage drop across the respective diodes. Thus, the most positive potential of base electrodes 40*b* and 60*b* will be in the order of approximately +0.3 volt, which is the normal voltage drop across most commercially available semiconductive diodes.

Since diodes 99 and 100 are connected to conduct current towards the base electrodes 40*b* and 60*b* respectively, they prevent the bases from attaining a negative potential greater than the voltage drop thereacross, that is, approximately −0.3 volt. It is now evident that diodes 48 and 68 in conjunction with diodes 99 and 100 limit the voltage swing at bases 40*b* and 60*b* to approximately 0.6 volt (±0.3 volt).

In considering the operation of the trigger circuit of FIG. 2, assume that transistor 60 is initially Off and transistor 40 is initially On. Under these conditions juncture 72 is at approximately −6 volts and juncture 52 is at approximately −3 volts. Since juncture 52 is Up the output of emitter follower 96 is Up thus causing the cathode of diode 98 to be at approximately −3 volts. Prior to the receipt of an input pulse, input terminals 78 will be at approximately −3 volts so that both of the inputs to the AND circuit including diodes 79 and 98 are Up. Hence, juncture 80 will be at approximately −3 volts. It will be shown hereinbelow that under the conditions assumed the AND circuit including diodes 79 and 98 will be responsive to the next input pulse to switch the trigger.

Prior to the occurrence of the next input pulse, the cathode of diode 84 is at approximately −3 volts. However, juncture 85 is at approximately −6 volts since juncture 72 (transistor 60 Off) and thus emitter 91*e* is at −6 volts. Upon the receipt of the next input pulse the potential of juncture 85 will not change immediately. Thus the AND circuit comprising diodes 84 and 94 is not involved in switching the trigger circuit under the assumed initial condition of transistor 60 being Off and transistor 40 being On.

As indicated in FIG. 2, the next input pulse changes the potential of terminal 78 from −3 volts to −6 volts. As noted above, the potential change on terminal 78 representing the leading edge of an input pulse does not effect the AND circuit including diodes 84 and 94. However, the leading edge of the input pulse increases the voltage drop across diode 79 and resistor 82 which causes juncture 80 to drop from −3 volts to −6 volts. Prior to the occurrence of the input pulse, base 60*b* of transistor 60 was approximately 0.3 volt positive with respect to ground. Since the charge on capacitor 81 cannot change immediately, the negative direction potential change on juncture 80 due to the leading edge of the input pulse is transmitted through the capacitor causing the potential of the base of transistor 60 to be driven negative. The negative potential excursion at base 60*b* renders diode 68 non-conductive so that the base can assume a potential negative with respect to ground.

The base 60*b* of transistor 60 being driven negative with respect to the emitter thereof by the input pulse permits emitter current to flow in transistor 60. As noted hereinbefore, the positive voltage source 44 in conjunction with resistor 43 approximate a constant current source. Thus since the emitter current of transistor 60 has increased, the emitter current of transistor 40 must necessarily be decreased. Assuming that the input pulse is of sufficient duration, the process whereby the emitter current of transistor 60 increases and that of transistor 40 decreases continues until all the available current at juncture 42 is being conducted by the emitter of transistor 60. At this point, transistor 40 is turned Off and transistor 60 is turned On.

After the state of the trigger has been transferred so that transistor 40 is now Off and transistor 60 is On, the new state of the trigger is maintained by the cross coupling resistors 90 and 95 as explained hereinabove. Upon the receipt of the next negative direction input pulse the state of the trigger circuit will again be switched in the manner described above so as to re-establish the initially assumed condition of transistors 40 and 60 being respectively On and Off.

It should be noted that following the negative direction leading edge of the input pulse capacitor 81 must charge from approximately 3 volts to approximately 6 volts. Capacitor 86 was previously charged to 6 volts and now must discharge to approximately 3 volts. The time constant of the gating circuit is determined by diode 68, capacitor 81 and resistor 82 for example, must be such that the gate circuit recovers prior to the receipt of the next input pulse at terminal 78.

While there have been shown and described and pointed out the fundamental novel features of the invention as applied to a preferred embodiment, it will be understood that various omissions and substitutions and changes in the form and details of the device illustrated and in its operation may be made by those skilled in the art, without departing from the spirit of the invention. It is the intention, therefore, to be limited only as indicated by the scope of the following claims.

What is claimed is:

1. An inverting circuit comprising first and second transistors each having emitter, base and collector electrodes, said second transistor connected to operate as a common base stage, the base of said second transistor being connected to a fixed source of potential to condition said second transistor for conduction at all times, a second source of potential, a load impedance coupling a first terminal of said second source of potential to the collector electrode of said second transistor, the emitter of said second transistor being coupled only to the collector of said first transistor, whereby the emitter current of said second transistor is the collector current of said first transistor, a constant current source connected to the emitter of said first transistor, said constant current source including a source of potential coupled to said emitter of said first transistor and an asymmetrically conductive impedance device coupled to the junction of said potential source and emitter, a biasing network coupled to the base of said first transistor for reverse biasing the emitter-base junction thereof, and means coupling an input switching signal of proper polarity to the base of said first transistor for rendering said first transistor conductive thereby producing a variation in the potential at the output of said second transistor in a sense opposite to the direction of variation of said input switching signal.

2. A bistable circuit comprising a first pair of semiconductive devices each having emitter, base and collector electrodes, a second pair of semiconductive devices, each as the sole collector impedance means for a respective one of said first pair of semiconductive devices whereby the collector currents of said first pair of semiconductive devices correspond respectively to the emitter currents of said second pair of semiconductive devices, constant current sources means coupled to the emitters of said first pair of semiconductive devices to selectively supply current to said first pair, said constant current sources including a source of potential coupled to said emitters of said first pair of semiconductive devices wherein one of said first pair of semiconductive devices provides an asymmetric current path for shunting current from said source away from said other of said first pair of semiconductive devices, means biasing each base electrode of said first pair with respect to the respective emitters thereof, and cross coupling means coupling the base electrodes of each semiconductive device of said first pair to a point in the collector circuit of the opposite device of said second pair.

3. A bistable circuit comprising first, second, third and fourth transistors each having emitter, base and collector electrodes, said third and fourth transistors each operated as common base stages and respectively connected as the sole collector load impedance of said first and second transistors, means coupling said third transistor to the base of said second transistor for reverse biasing the emitter-base junction of said second transistor when said first transistor is conductive, second means coupling said fourth transistor to the base of said first transistor for reverse biasing the emitter-base junction of said first transistor when said second transistor is conductive, whereby only one of said first and second transistors is conducting current, and constant current source means coupled to the emitter electrodes of said first and second transistors for limiting the emitter current of the conducting transistor to a value below the region of saturation said constant current source means including a source of potential coupled to the emitters of said first and second transistors wherein the one of said first and second transistors conducting current provides an asymmetric current path for shunting current from said source away from said other of said first and second transistors.

4. A circuit comprising an inverter, said inverter comprising first and second semiconductive devices having emitter, base and collector electrodes, said emitters of said semiconductive devices being connected in common with a source of potential wherein one of said first and second semiconductive devices provides an asymmetric current path for shunting the current from said source of potential away from said other of said first and second semiconductive devices, a current conductive path, the collector of said first semiconductive device being connected only to the emitter of said second semiconductive device, said constant current source being connected to the emitter of said first semiconductive device, means to selectively permit the constant current generated by said current source to flow through said devices responsive to an input signal at the base of said first semiconductive device.

5. In a circuit a pair of inverters each as defined as in claim 4 and means for cross coupling the outputs of the second semiconductive devices of each pair to the inputs of the first semiconductive devices of each pair.

References Cited in the file of this patent

UNITED STATES PATENTS

| | | |
|---|---|---|
| 2,663,800 | Herzog | Dec. 22, 1953 |
| 2,787,712 | Priebe | Apr. 2, 1957 |
| 2,802,065 | Sziklai | Aug. 6, 1957 |
| 2,825,821 | Logue | Mar. 4, 1958 |
| 2,835,829 | Sourgens | May 20, 1958 |
| 2,864,961 | Lohman | Dec. 16, 1958 |
| 2,885,573 | Clapper | May 5, 1959 |
| 2,896,094 | Moody | July 21, 1959 |
| 2,926,307 | Ehret | Feb. 23, 1960 |
| 2,928,011 | Campbell | Mar. 8, 1960 |
| 2,945,965 | Clark | July 19, 1960 |
| 2,947,882 | Chou | Aug. 2, 1960 |